(12) United States Patent
Bui et al.

(10) Patent No.: US 8,907,440 B2
(45) Date of Patent: Dec. 9, 2014

(54) HIGH SPEED BACKSIDE ILLUMINATED, FRONT SIDE CONTACT PHOTODIODE ARRAY

(71) Applicant: OSI Optoelectronics, Hawthorne, CA (US)

(72) Inventors: Peter Steven Bui, Cerritos, CA (US); Narayan Dass Taneja, Long Beach, CA (US)

(73) Assignee: OSI Optoelectronics, Inc., Hawthorne, CA (US)

( * ) Notice: Subject to any disclaimer, the term of this patent is extended or adjusted under 35 U.S.C. 154(b) by 0 days.

(21) Appl. No.: 13/955,299

(22) Filed: Jul. 31, 2013

(65) Prior Publication Data
US 2014/0061843 A1 Mar. 6, 2014

Related U.S. Application Data

(63) Continuation of application No. 12/709,621, filed on Feb. 22, 2010, now Pat. No. 8,519,503, which is a (Continued)

(51) Int. Cl.
*H01L 31/102* (2006.01)
*H01L 31/0352* (2006.01)
*H01L 27/146* (2006.01)
*H01L 27/144* (2006.01)

(52) U.S. Cl.
CPC ........ *H01L 31/102* (2013.01); *H01L 31/03529* (2013.01); *H01L 27/14658* (2013.01); *H01L 27/1446* (2013.01); *H01L 27/14603* (2013.01); *Y02E 10/50* (2013.01)
USPC ........................................ 257/448

(58) Field of Classification Search
CPC ............ H01L 27/14643; H01L 27/1446; H01L 31/103
USPC ......... 257/233, 290–292, 414, 431–496, 110, 257/279, 509, 525, 544–550, 656, 927, 929, 257/E21.008–E21.021, E21.364; 438/48, 438/54, 65, 69, 70, 171, 190, 210, 238–253, 438/329, 379, 387, 444, 901
See application file for complete search history.

(56) References Cited

U.S. PATENT DOCUMENTS 3,041,226 A 6/1962 Pennington
3,713,921 A 1/1973 Fleischer et al.
(Continued)

FOREIGN PATENT DOCUMENTS

EP 0347157 A2 12/1989
EP 0436282 A2 7/1991
(Continued)

OTHER PUBLICATIONS

Y Akatsu, Y. Muramoto, K. Kato, M. Ikeda, M. Ueki, A. Kozen, T. Kurosaki, K. Kawano, and J. Yoshida, 'Long-wavelength multimode waveguide photodiodes suitable for hybrid optical module integrated with planar lightwave circuit', Electron. Lett., vol. 31, pp. 2098-2100, 1995.

(Continued)

*Primary Examiner* — David Vu
*Assistant Examiner* — Jonathan Han
(74) *Attorney, Agent, or Firm* — Novel IP

(57) ABSTRACT

The present specification discloses front-side contact backside illuminated (FSC-BSL) photodiode array having improved characteristics such as high speed of each photodiode, uniformity of the bias voltage applied to different photodiode, low bias voltage, reduced resistance of each photodiode, and an associated reduction in noise. The photodiode array is made of photodiodes with front metallic cathode pads, front metallic anode pad, back metallic cathode pads, n+ doped regions and a p+ doped region. The front metallic cathode pads physically contact the n+ doped regions and the front metallic anode pad physically contacts the p+ doped region. The back metallic cathode pads physically contact the n+ doped region.

18 Claims, 13 Drawing Sheets

Related U.S. Application Data continuation-in-part of application No. 12/637,529, filed on Dec. 14, 2009, now Pat. No. 8,049,294, which is a continuation of application No. 11/555,367, filed on Nov. 1, 2006, now Pat. No. 7,656,001, said application No. 12/709,621 is a continuation-in-part of application No. 12/637,557, filed on Dec. 14, 2009, now Pat. No. 7,968,964, which is a continuation of application No. 11/532,191, filed on Sep. 15, 2006, now Pat. No. 7,655,999, said application No.12/709,621 is a continuation-in-part of application No. 12/559,498, filed on Sep. 15, 2009, now Pat. No. 8,766,392, which is a continuation-in-part of application No. 11/744,908, filed on May 7, 2007, now Pat. No. 8,164,151, said application No. 12/709,621 is a continuation-in-part of application No. 12/505,610, filed on Jul. 20, 2009, now abandoned, which is a continuation of application No. 11/401,099, filed on Apr. 10, 2006, now Pat. No. 7,579,666, which is a continuation of application No. 10/797,324, filed on Mar. 10, 2004, now Pat. No. 7,057,254, said application No. 12/709,621 is a continuation-in-part of application No. 12/499,203, filed on Jul. 8, 2009, now Pat. No. 8,674,401, which is a continuation of application No. 11/258,848, filed on Oct. 25, 2005, now Pat. No. 7,576,369, said application No. 12/709,621 is a continuation-in-part of application No. 12/325,304, filed on Dec. 1, 2008, now Pat. No. 7,898,055, which is a continuation of application No. 11/774,022, filed on Jul. 6, 2007, now Pat. No. 7,590,961, which is a continuation of application No. 10/925,185, filed on Aug. 24, 2004, now abandoned, said application No. 12/325,304 is a continuation of application No. 11/081,219, filed on Mar. 16, 2005, now Pat. No. 7,256,470, said application No. 12/709,621 is a continuation-in-part of application No. 11/849,623, filed on Sep. 4, 2007, now Pat. No. 7,728,367, and a continuation-in-part of application No. 11/422,246, filed on Jun. 5, 2006, now Pat. No. 8,120,023.

(60) Provisional application No. 61/159,732, filed on Mar. 12, 2009, provisional application No. 61/099,768, filed on Sep. 24, 2008, provisional application No. 61/096,877, filed on Sep. 15, 2008, provisional application No. 60/468,181, filed on May 5, 2003.

(56) References Cited

U.S. PATENT DOCUMENTS

| | | |
|---|---|---|
| 3,765,969 A | 10/1973 | Kragness et al. |
| 3,801,390 A | 4/1974 | Lepselter et al. |
| 3,808,068 A | 4/1974 | Johnson et al. |
| 3,887,936 A | 6/1975 | Shannon et al. |
| 3,895,976 A | 7/1975 | Dumas |
| 3,982,269 A | 9/1976 | Torreno |
| 4,190,467 A | 2/1980 | Lien |
| 4,200,472 A | 4/1980 | Chappell |
| 4,210,923 A | 7/1980 | North et al. |
| 4,219,368 A | 8/1980 | David |
| 4,238,760 A | 12/1980 | Carr |
| 4,290,844 A | 9/1981 | Rotolante et al. |
| 4,329,702 A | 5/1982 | Wallace |
| 4,874,939 A | 10/1989 | Nishimoto et al. |
| 4,887,140 A | 12/1989 | Wang |
| 4,904,608 A | 2/1990 | Gentner et al. |
| 4,904,861 A | 2/1990 | Epstein et al. |
| 4,998,013 A | 3/1991 | Epstein et al. |
| 5,049,962 A | 9/1991 | Huang et al. |
| 5,053,318 A | 10/1991 | Gulla et al. |
| 5,144,379 A | 9/1992 | Eshita et al. |
| 5,214,276 A | 5/1993 | Himoto et al. |
| 5,237,197 A | 8/1993 | Snoeys et al. |
| 5,252,142 A | 10/1993 | Matsuyama et al. |
| 5,254,480 A | 10/1993 | Tran |
| 5,276,955 A | 1/1994 | Noddin et al. |
| 5,408,122 A | 4/1995 | Reele |
| 5,414,295 A | 5/1995 | Le Roux |
| 5,430,321 A | 7/1995 | Effelsberg |
| 5,446,308 A | 8/1995 | Piccone et al. |
| 5,446,751 A | 8/1995 | Wake |
| 5,457,322 A | 10/1995 | Kitaguchi |
| 5,501,990 A | 3/1996 | Holm et al. |
| 5,517,052 A | 5/1996 | Ishaque |
| 5,543,736 A | 8/1996 | Gardner |
| 5,576,559 A | 11/1996 | Davis |
| 5,599,389 A | 2/1997 | Iwasaki |
| 5,608,237 A | 3/1997 | Aizawa |
| 5,656,508 A | 8/1997 | So et al. |
| 5,670,383 A | 9/1997 | Piccone |
| 5,670,817 A | 9/1997 | Robinson |
| 5,698,454 A | 12/1997 | Zommer |
| 5,777,352 A | 7/1998 | Reele |
| 5,818,096 A | 10/1998 | Ishibashi et al. |
| 5,825,047 A | 10/1998 | Ajisawa et al. |
| 5,869,834 A | 2/1999 | Wipenmyr |
| 5,880,482 A | 3/1999 | Adesida |
| 5,889,313 A | 3/1999 | Parker |
| 5,914,502 A | 6/1999 | Simmonet |
| 5,923,720 A | 7/1999 | Barton et al. |
| 5,928,438 A | 7/1999 | Salami et al. |
| 6,027,956 A | 2/2000 | Irissou |
| 6,031,254 A | 2/2000 | Quoirin |
| 6,075,275 A | 6/2000 | Irissou |
| 6,121,552 A | 9/2000 | Brosnihan |
| 6,144,379 A | 11/2000 | Bertram |
| 6,169,319 B1 | 1/2001 | Malinovich |
| 6,175,141 B1 | 1/2001 | Hofbauer et al. |
| 6,204,087 B1 | 3/2001 | Parker |
| 6,218,684 B1 | 4/2001 | Kuhara et al. |
| 6,218,704 B1 | 4/2001 | Brown |
| 6,277,668 B1 | 8/2001 | Goossen |
| 6,303,967 B1 | 10/2001 | Irissou |
| 6,326,300 B1 | 12/2001 | Liu et al. |
| 6,326,649 B1 | 12/2001 | Chang et al. |
| 6,352,517 B1 | 3/2002 | Flock et al. |
| 6,392,282 B1 | 5/2002 | Sahara |
| 6,399,991 B1 | 6/2002 | Ando |
| 6,426,991 B1 | 7/2002 | Mattson et al. |
| 6,438,296 B1 | 8/2002 | Kongable |
| 6,458,619 B1 | 10/2002 | Irissou |
| 6,483,130 B1 | 11/2002 | Yang |
| 6,489,635 B1 | 12/2002 | Sugg |
| 6,504,158 B2 | 1/2003 | Possin |
| 6,504,178 B2 | 1/2003 | Carlson |
| 6,507,050 B1 | 1/2003 | Green |
| 6,510,195 B1 | 1/2003 | Chappo et al. |
| 6,541,836 B2 | 4/2003 | Iwanczyk |
| 6,546,171 B2 | 4/2003 | Fukutomi |
| 6,569,700 B2 | 5/2003 | Yang |
| 6,593,636 B1 * | 7/2003 | Bui et al. .................. 257/463 |
| 6,613,974 B2 | 9/2003 | Husher |
| 6,667,528 B2 | 12/2003 | Cohen |
| 6,670,258 B2 | 12/2003 | Carlson et al. |
| 6,677,182 B2 | 1/2004 | Carlson |
| 6,683,326 B2 | 1/2004 | Iguchi |
| 6,690,078 B1 | 2/2004 | North |
| 6,713,768 B2 | 3/2004 | Iwanczyk |
| 6,734,416 B2 | 5/2004 | Carlson et al. |
| 6,762,473 B1 | 7/2004 | Goushcha |
| 6,772,729 B2 | 8/2004 | Brosseau et al. |
| 6,815,790 B2 | 11/2004 | Bui et al. |
| 6,826,080 B2 | 11/2004 | Park et al. |
| 6,853,046 B2 | 2/2005 | Shibayama |
| 6,914,271 B2 | 7/2005 | Menard |
| 7,019,338 B1 | 3/2006 | Ballon |
| 7,038,288 B2 | 5/2006 | Lai |

(56) References Cited

U.S. PATENT DOCUMENTS

| | | |
|---|---|---|
| 7,057,254 B2 | 6/2006 | Bui et al. |
| 7,057,257 B2 | 6/2006 | Tran |
| 7,112,465 B2 | 9/2006 | Goushcha et al. |
| 7,138,697 B2 | 11/2006 | Chu |
| 7,148,464 B2 | 12/2006 | Shibayama |
| 7,157,785 B2 | 1/2007 | Takei |
| 7,161,155 B1 | 1/2007 | Deych |
| 7,198,972 B2 | 4/2007 | Sato |
| 7,242,009 B1 | 7/2007 | Wilson |
| 7,242,069 B2 | 7/2007 | Bui et al. |
| 7,256,386 B2 | 8/2007 | Carlson |
| 7,256,470 B2 | 8/2007 | Bui et al. |
| 7,279,731 B1 | 10/2007 | Bui et al. |
| 7,423,305 B2 | 9/2008 | Shinohara |
| 7,456,453 B2 | 11/2008 | Inoue |
| 7,470,966 B2 | 12/2008 | Bui |
| 7,560,790 B2 | 7/2009 | Shibayama |
| 7,560,791 B2 | 7/2009 | Wilson |
| 7,576,369 B2 | 8/2009 | Bui |
| 7,579,666 B2 | 8/2009 | Bui |
| 7,622,785 B2 | 11/2009 | Sasagawa |
| 7,649,236 B2 | 1/2010 | Fujii |
| 7,655,999 B2 | 2/2010 | Bui |
| 7,656,001 B2 | 2/2010 | Bui |
| 7,709,921 B2 | 5/2010 | Bui |
| 7,728,367 B2 | 6/2010 | Bui |
| 7,810,740 B2 | 10/2010 | Shibayama |
| 7,880,258 B2 | 2/2011 | Bui et al. |
| 7,898,055 B2 | 3/2011 | Bui |
| 7,948,049 B2 | 5/2011 | Bui |
| 7,968,964 B2 | 6/2011 | Bui |
| 8,035,183 B2 | 10/2011 | Bui |
| 8,049,294 B2 | 11/2011 | Bui |
| 8,120,023 B2 | 2/2012 | Bui |
| 8,164,151 B2 | 4/2012 | Bui et al. |
| 8,324,670 B2 | 12/2012 | Bui |
| 8,338,905 B2 | 12/2012 | Bui |
| 8,399,909 B2 | 3/2013 | Bui |
| 8,461,541 B2 | 6/2013 | Garcia |
| 8,476,725 B2 | 7/2013 | Bui |
| 8,519,503 B2 | 8/2013 | Bui |
| 8,674,401 B2 | 3/2014 | Bui |
| 8,686,529 B2 | 4/2014 | Bui |
| 2001/0034105 A1 | 10/2001 | Carlson |
| 2002/0020893 A1 | 2/2002 | Lhorte |
| 2002/0056845 A1 | 5/2002 | Iguchi et al. |
| 2002/0148967 A1 | 10/2002 | Iwanczyk |
| 2003/0116187 A1 | 6/2003 | Husher |
| 2004/0104351 A1 | 6/2004 | Shibayama |
| 2004/0113185 A1 | 6/2004 | Shibayama |
| 2004/0129991 A1 | 7/2004 | Lai |
| 2004/0129992 A1 | 7/2004 | Shibayama |
| 2004/0135170 A1 | 7/2004 | Menard |
| 2004/0206886 A1 | 10/2004 | Carlson et al. |
| 2004/0222358 A1* | 11/2004 | Bui et al. ............ 250/214.1 |
| 2004/0222482 A1 | 11/2004 | Bui |
| 2004/0241897 A1 | 12/2004 | Rhee et al. |
| 2004/0262652 A1 | 12/2004 | Gouschcha et al. |
| 2005/0082640 A1 | 4/2005 | Takei |
| 2005/0184354 A1 | 8/2005 | Chu |
| 2005/0186754 A1 | 8/2005 | Kim |
| 2006/0220078 A1 | 10/2006 | Bui et al. |
| 2006/0255420 A1 | 11/2006 | Bui et al. |
| 2006/0278896 A1 | 12/2006 | Inoue |
| 2006/0278898 A1 | 12/2006 | Shibayama |
| 2007/0090394 A1 | 4/2007 | Bui et al. |
| 2007/0257329 A1 | 11/2007 | Bui et al. |
| 2007/0278534 A1 | 12/2007 | Bui et al. |
| 2007/0296005 A1 | 12/2007 | Bui et al. |
| 2008/0067622 A1 | 3/2008 | Bui et al. |
| 2008/0099871 A1 | 5/2008 | Bui et al. |
| 2008/0128846 A1 | 6/2008 | Bui et al. |
| 2008/0277753 A1 | 11/2008 | Bui et al. |
| 2010/0032710 A1 | 2/2010 | Bui |
| 2010/0065939 A1 | 3/2010 | Bui |
| 2010/0213565 A1 | 8/2010 | Bui |
| 2011/0079728 A1 | 4/2011 | Garcia |
| 2011/0175188 A1 | 7/2011 | Bui |
| 2012/0104532 A1 | 5/2012 | Bui |

FOREIGN PATENT DOCUMENTS

| | | |
|---|---|---|
| EP | 0723301 A2 | 7/1996 |
| EP | 0723301 B1 | 7/2000 |
| EP | 1069626 | 1/2001 |
| EP | 1069626 A2 | 1/2001 |
| EP | 1205983 | 5/2002 |
| EP | 1205983 A1 | 5/2002 |
| WO | 0052766 | 9/2000 |
| WO | 0052766 A1 | 9/2000 |
| WO | 2010031011 | 3/2010 |

OTHER PUBLICATIONS

Fukano et al., 'High-REsponsivity and Low-Operation-Voltage Edge-Illuminated Refracting-Facet Photodiodes with Large Alignment Tolerance for Single-Mode Fiber', Journal of Lightwave Technology, vol. 16, No. 5, May 1997.

International Search Report PCT/US2009/056875, Jan. 7, 2010, UDT Sensors, Inc.

* cited by examiner

*Step 805*

*Step 810*

*Step 815*

*Step 820*

Step 825

Step 830

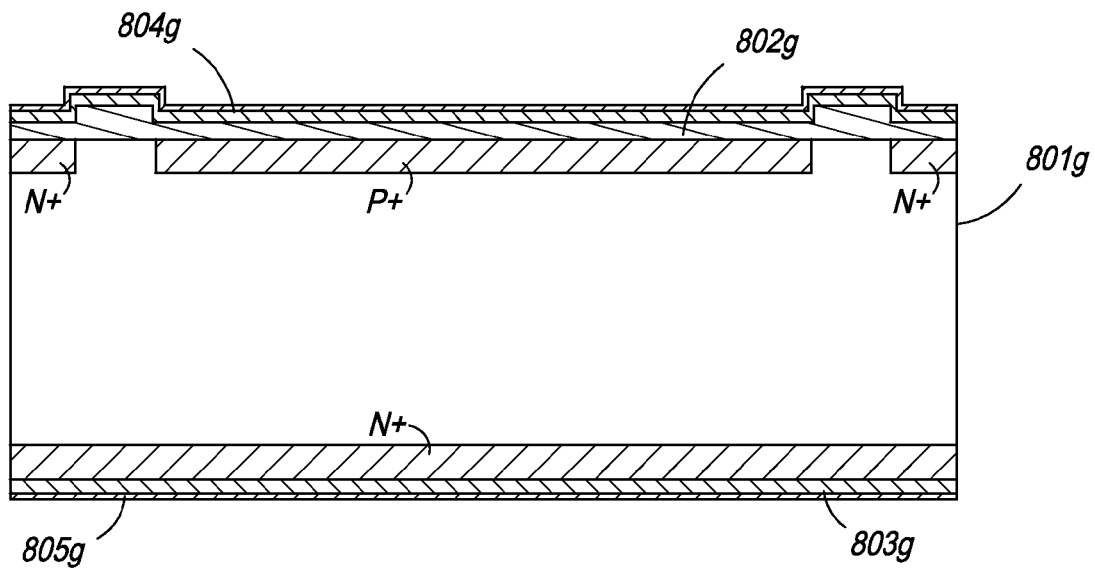
FIG. 8g  Step 835
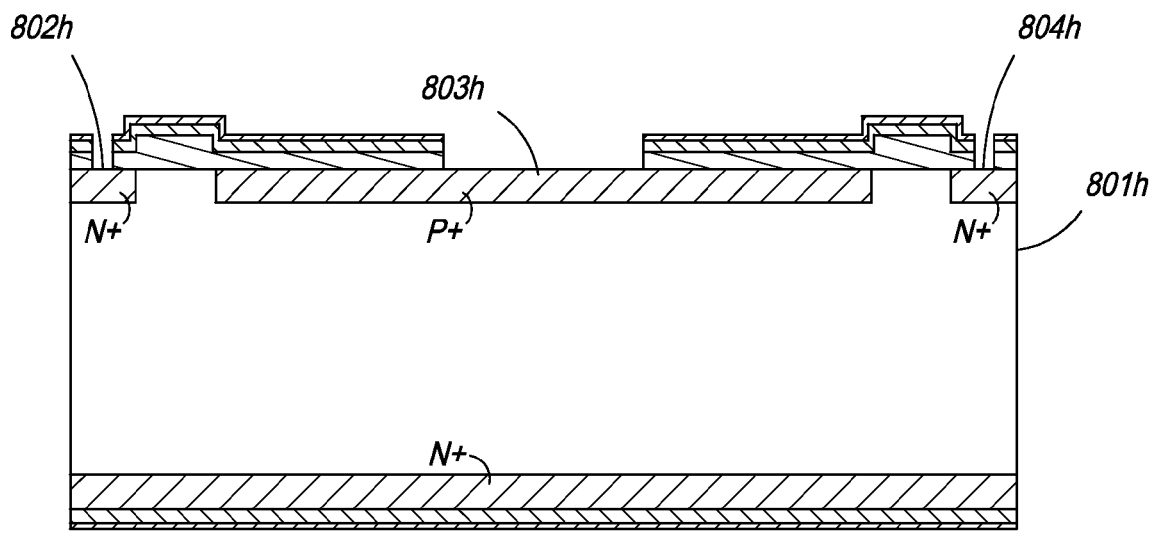
FIG. 8h  Step 840

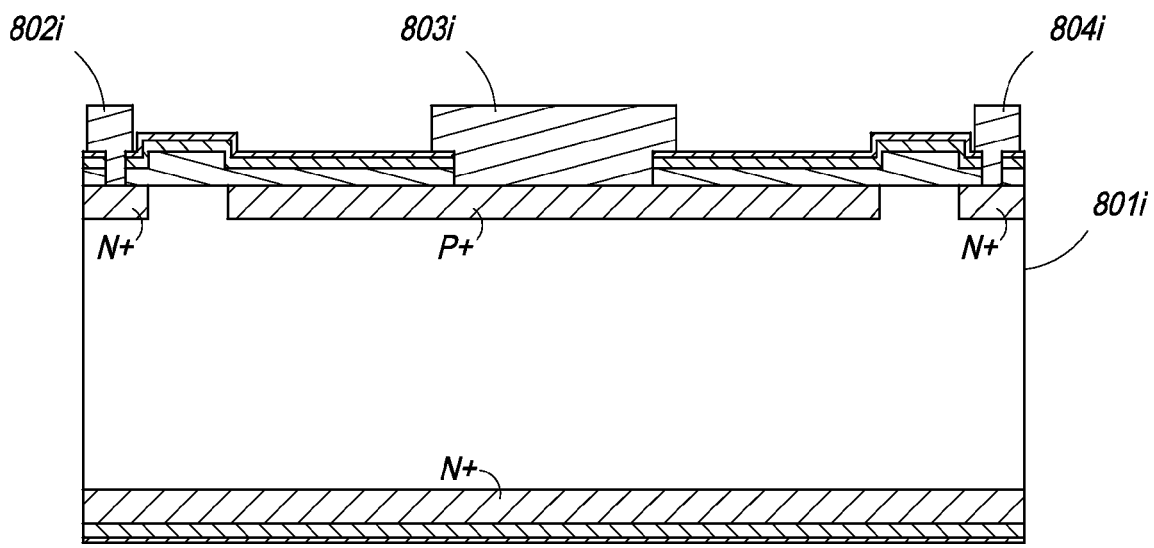
FIG. 8i    Step 845
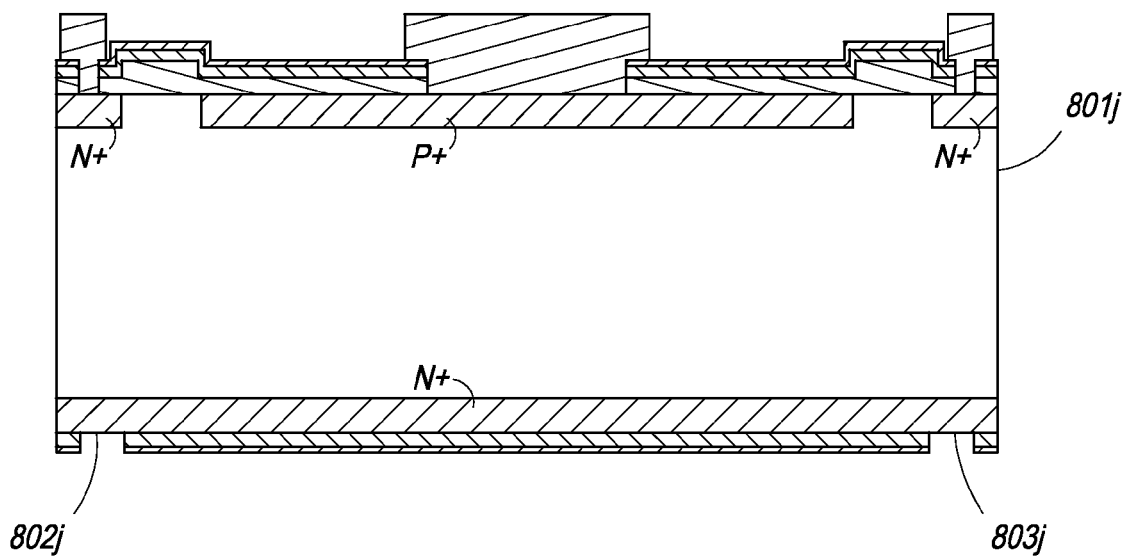
FIG. 8j    Step 850

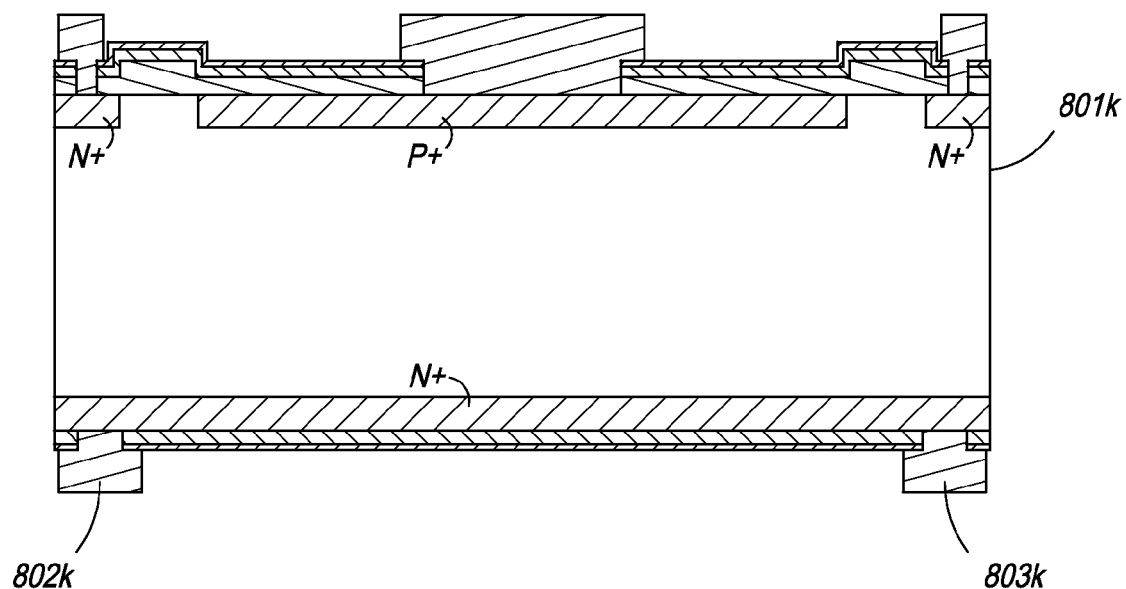
FIG. 8k  Step 855

HIGH SPEED BACKSIDE ILLUMINATED, FRONT SIDE CONTACT PHOTODIODE ARRAY

CROSS-REFERENCE

The present invention is a continuation-in-part of 1) U.S. patent Ser. No. 12/559,498, filed on Sep. 15, 2009, 2) U.S. patent Ser. No. 12/744,908, filed on May 7, 2007, 3) U.S. patent Ser. No. 11/422,246, filed on Jun. 5, 2006, 4) U.S. patent Ser. No. 12/637,557, filed on Dec. 14, 2009, 5) Ser. No. 12/637,529, filed on Dec. 14, 2009, 6) U.S. patent Ser. No. 12/499,203, filed on Jul. 8, 2009, 7) U.S. patent Ser. No. 11/849,623, filed on Sep. 4, 2007, 8) U.S. patent Ser. No. 12/325,304, filed on Dec. 1, 2008, and 9) U.S. patent Ser. No. 12/505,610, filed on Jul. 20, 2009. All of the aforementioned specifications are incorporated herein by reference in their entirety.

FIELD OF INVENTION

The present invention relates generally to the field of radiation detectors and more specifically to back side illuminated, front side contact photodiode/photodiode arrays having high speed at low biasing.

BACKGROUND OF THE INVENTION

Photodiodes comprise of multiple radiation sensitive junctions formed in semiconductor material. Within a photodiode, charge carriers are created by light that illuminates the junction and photo current is generated dependent upon the degree of illumination. Similarly, photodiode array comprises of large number of light sensitive spaced-apart elements, comprising of a semiconductor junction and a region of high response where the photo-generated charge carriers are collected. Array of photodiodes or basically photodiodes are used in various applications including, but not limited to, optical position encoding, and low light-level imaging, such as night photography, nuclear medical imaging, photon medical imaging, multi-slice computer tomography (CT) imaging, radiation detection and ballistic photon detection.

Photodiodes are characterized by certain characteristics, such as electrical, optical, current (I), voltage (V), and noise. Electrical characteristics of photodiode dominantly include shunt resistance, series resistance, junction capacitance, rise or fall time and frequency response. Noise in photodiodes is generated by a plurality of sources including, but not limited to, thermal noise, quantum or photon noise, and flicker noise.

Detection devices are susceptible to numerous radiation damage mechanisms due to increased reverse-bias current and decreased forward voltage over time. Change in doping level, due to radiation damage, adversely affects the width of the depletion region and a decrease in carrier lifetime results in signal loss as carriers recombine while traversing the depletion region.

Also, in certain applications, optical detectors having small lateral dimensions and spaced closely together are favourably produced. For example in certain medical applications, it would be beneficial to increase the optical resolution of a detector array in order to permit for improved image scans, such as computer tomography scans. However, the diffusion length of minority carriers by photon interaction in the semiconductor is in the range of at least many tens of microns in conventional doping levels utilized for diode arrays. Such minority carriers have potential to affect signals at diodes away from the region at which the minority were generated. Therefore, the spatial resolution obtainable may be limited by diffusion of the carriers within the semiconductor itself, even if other components of the optical system are optimized and scattered light is reduced.

Furthermore, another disadvantage of the abovementioned structure of the typical photodiode is for high speed application. Since the cathode contact is located only on the front side, it requires a higher voltage to fully deplete the device and even after the device is fully depleted, under reverse bias the electrons need to travel the undepleted high resistivity zone at the side of the chip to the top contact. The consequence of this is a high series resistance and a low speed due to a high RC-time component of the device. Due to high series resistance and low speed the photodiodes are rendered inappropriate for high speed applications.

In light of the abovementioned disadvantages, there is a need for front side contact, back side illuminated photodiode array having improved characteristics, including high production throughput, low cost manufacturing, uniform as well as high photocurrent density. Further, there is also a need for photodiode/photodiode array having high speed at low biasing voltages.

SUMMARY OF THE INVENTION

The present specification discloses a photodiode array having a front side and a back side separated by a layer of silicon and a top edge, a bottom edge, a right edge, and a left edge, comprising: a plurality of metallic cathode pads extending from said front side of the photodiode array wherein each of said metallic cathode pads is in physical contact with at least one n+ doped region; a plurality of metallic cathode pads extending from said back side of the photodiode array wherein each of said metallic cathode pads is in physical contact with a second n+ doped region; a metallic grid on the front side of said array, wherein said metallic grid forms a plurality of rows in parallel to said top edge and bottom edge and perpendicular to said right edge and left edge, wherein said metallic grid forms a plurality of columns in parallel to said right edge and left edge and perpendicular to said top edge and bottom edge, and wherein said metallic grid interconnects each of said plurality of metallic cathode pads extending from said front side of the photodiode array; and a metallic grid on the back side of said array, wherein said metallic grid forms a plurality of rows in parallel to said top edge and bottom edge and perpendicular to said right edge and left edge, wherein said metallic grid forms a plurality of columns in parallel to said right edge and left edge and perpendicular to said top edge and bottom edge, and wherein said metallic grid interconnects each of said plurality of metallic cathode pads extending from said back side of the photodiode array.

Optionally, the photodiode array is comprised of a plurality of photodiodes, each of said photodiodes comprising a first metallic cathode pad and a second metallic cathode pad extending from said front side of the photodiode array. Each of said photodiodes has an anode pad extending from the said front side of the photodiode array and wherein said anode pad is positioned between said first cathode pad and second metallic cathode pad. The anode pad is in physical contact with a p+ doped region. The layer of silicon is in the range of 80 to 200 microns thick. The second n+ doped region is on the order of 0.3 micrometers. The second n+ doped region has a resistivity of approximately 0.005 Ohm-centimeter. The photodiode array is comprised of a plurality of photodiodes, each of said photodiodes having a resistance on the order of 10 to 100 ohm. The photodiode array has a rise time of 40 nanoseconds or less. In one embodiment, the metallic grid on the front said of said array defines a universal, multi-element array of cells wherein each cell comprises a photodiode. In one embodiment, the metallic grid on the front side of said array defines at least 64 cells, each of said cells comprising a photodiode.

The present specification discloses a photodiode array having a front side and a back side separated by a layer of silicon and a top edge, a bottom edge, a right edge, and a left edge, comprising: a plurality of metallic cathode pads extending from said front side of the photodiode array wherein each of said metallic cathode pads is in physical contact with at least one n+ doped region; a plurality of metallic cathode pads extending from said back side of the photodiode array wherein each of said metallic cathode pads is in physical contact with a second n+ doped region; a plurality of anode pads extending from the front side of the photodiode array, wherein each of said anode pads is positioned between a first metallic cathode pad and a second metallic cathode pad; and a metallic grid on the back side of said array, wherein said metallic grid forms a plurality of rows in parallel to said top edge and bottom edge and perpendicular to said right edge and left edge, wherein said metallic grid forms a plurality of columns in parallel to said right edge and left edge and perpendicular to said top edge and bottom edge, and wherein said metallic grid interconnects each of said plurality of metallic cathode pads extending from said back side of the photodiode array.

Optionally, the photodiode array is comprised of a plurality of photodiodes, each of said photodiodes comprising at least two metallic cathode pads extending from said front side of the photodiode array. The anode pad is in physical contact with a p+ doped region. The layer of silicon is on the order of 130 microns thick. The second n+ doped region is on the order of 0.3 micrometers. The second n+ doped region has a resistivity of approximately 0.005 Ohm-centimeter. The photodiode array is comprised of a plurality of photodiodes, each of said photodiodes having a resistance on the order of 10 to 100 ohm. The photodiode array has a rise time of 40 nanoseconds or less. The photodiode array further comprises a metallic grid on the front side of said array, wherein said metallic grid forms a plurality of rows in parallel to said top edge and bottom edge and perpendicular to said right edge and left edge, wherein said metallic grid forms a plurality of columns in parallel to said right edge and left edge and perpendicular to said top edge and bottom edge, and wherein said metallic grid interconnects each of said plurality of metallic cathode pads extending from said front side of the photodiode array. The metallic grid on the front side and back side of said array defines a universal, multi-element array of cells, wherein each of said cells comprises a photodiode.

BRIEF DESCRIPTION OF THE DRAWINGS

These and other features and advantages of the present invention will be appreciated, as they become better understood by reference to the following detailed description when considered in connection with the accompanying drawings:

FIG. 8g illustrates a seventh exemplary manufacturing step of the back side illuminated front side contact photodiode array of the present invention;

FIG. 8h illustrates a eighth exemplary manufacturing step of the back side illuminated front side contact photodiode array of the present invention;

FIG. 8i illustrates a ninth exemplary manufacturing step of the back side illuminated front side contact photodiode array of the present invention;

FIG. 8j illustrates a tenth exemplary manufacturing step of the back side illuminated front side contact photodiode array of the present invention; and FIG. 8k illustrates an eleventh exemplary manufacturing step of the back side illuminated front side contact photodiode array of the present invention.

DETAILED DESCRIPTION OF THE INVENTION

The present invention is directed towards detector structures, detector arrays, and design and implementation of detector arrays for a variety of applications including but not limited to computerized tomography (CT) and non CT applications. Specifically, the present invention is directed towards high density photodiode arrays manufactured at high throughput and low cost, capable of generating uniform as well as high density photocurrent The present invention is directed towards multiple embodiments. The following disclosure is provided in order to enable a person having ordinary skill in the art to practice the invention. Language used in this specification should not be interpreted as a general disavowal of any one specific embodiment or used to limit the claims beyond the meaning of the terms used therein. The general principles defined herein may be applied to other embodiments and applications without departing from the spirit and scope of the invention. Also, the terminology and phraseology used is for the purpose of describing exemplary embodiments and should not be considered limiting. Thus, the present invention is to be accorded the widest scope encompassing numerous alternatives, modifications and equivalents consistent with the principles and features disclosed. For purpose of clarity, details relating to technical material that is known in the technical fields related to the invention have not been described in detail so as not to unnecessarily obscure the present invention.

More specifically, the present invention is directed towards front-side contact back-side illuminated (FSC-BSL) photodiode array having improved characteristics such as high speed of each photodiode, uniformity of the bias voltage applied to different photodiode, low bias voltage, reduced resistance of each photodiode, and an associated reduction in noise.

Figure 1:
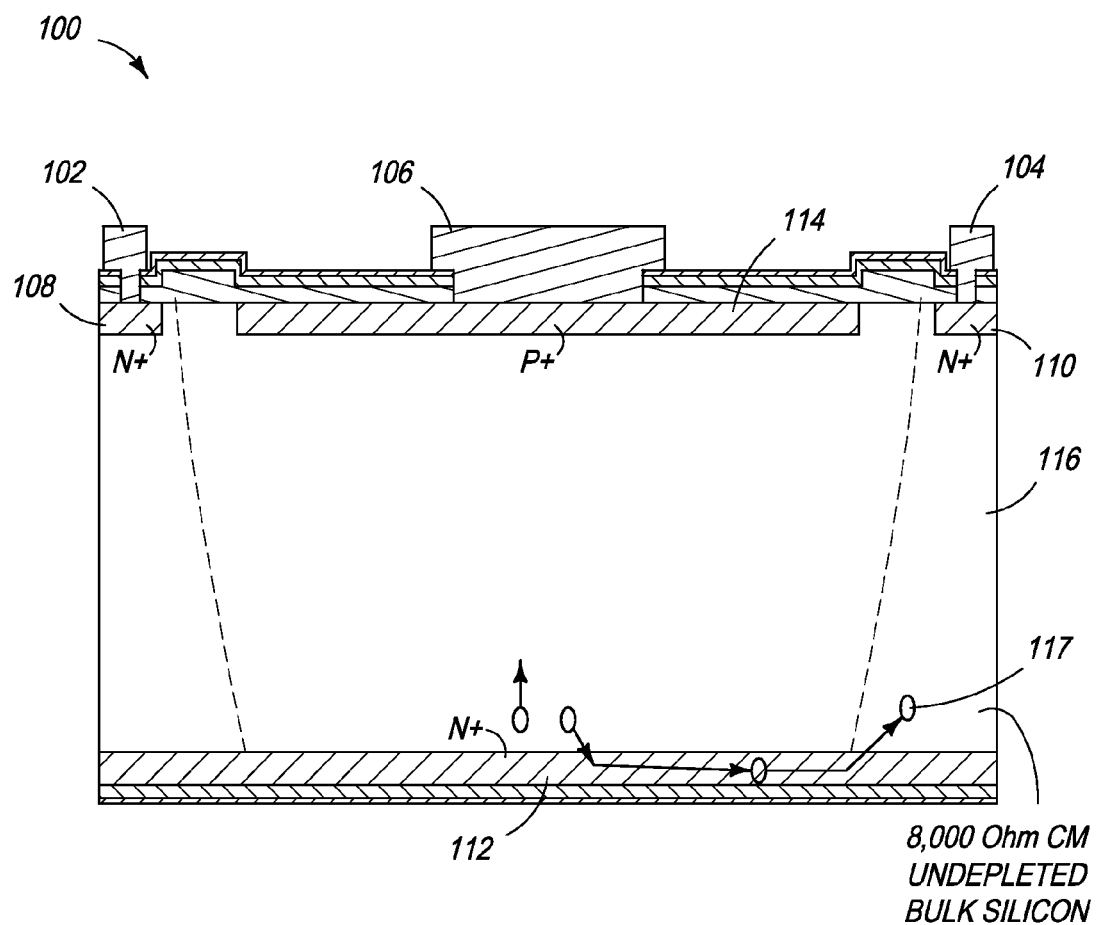
FIG. 1 shows a cross sectional view of a prior art back side illuminated photodiode.

FIG. 1 shows a cross sectional view of a prior art back side illuminated photodiode 100. The photodiode 100 comprises metallic cathode 102, 104, metallic anode 106, n+ doped regions 108, 110, 112 and p+ doped region 114. The metallic cathode 102, 104 is connected to the n+ doped region 108, 110 and the metallic anode 106 is connected to the p+ doped region. The metallic cathode 102, 104 and metallic anode 106 are provided at the front side of the photodiode 100. The n+ doped region 112 at the back side of the photodiode 100 is 0.3 μm thick and does not have any metal contacts.

The prior art photodiode 100 has substantial disadvantages, however, with respect to high speed applications. As the metallic cathode contacts 102, 104 are located only on the front side, a higher voltage is required to fully deplete the photodiode 100. Even in instances where the device is fully depleted under reverse bias, electrons 117, at the back side of the photodiode 100, need to travel the undepleted high resistivity zone 116 to reach the metallic cathode contacts 102, 104 at the front side. The high resistivity zone 116 is typically of the order of 8000 Ohm-centimeter. This results in high series resistance amongst the photodiodes and photodiode array and is of the order of 10 kohm-100 kohm. The high series resistance further results in low speed due to high RC time component, thus making the photodiode 100 inappropriate for high speed applications.

Figure 2:
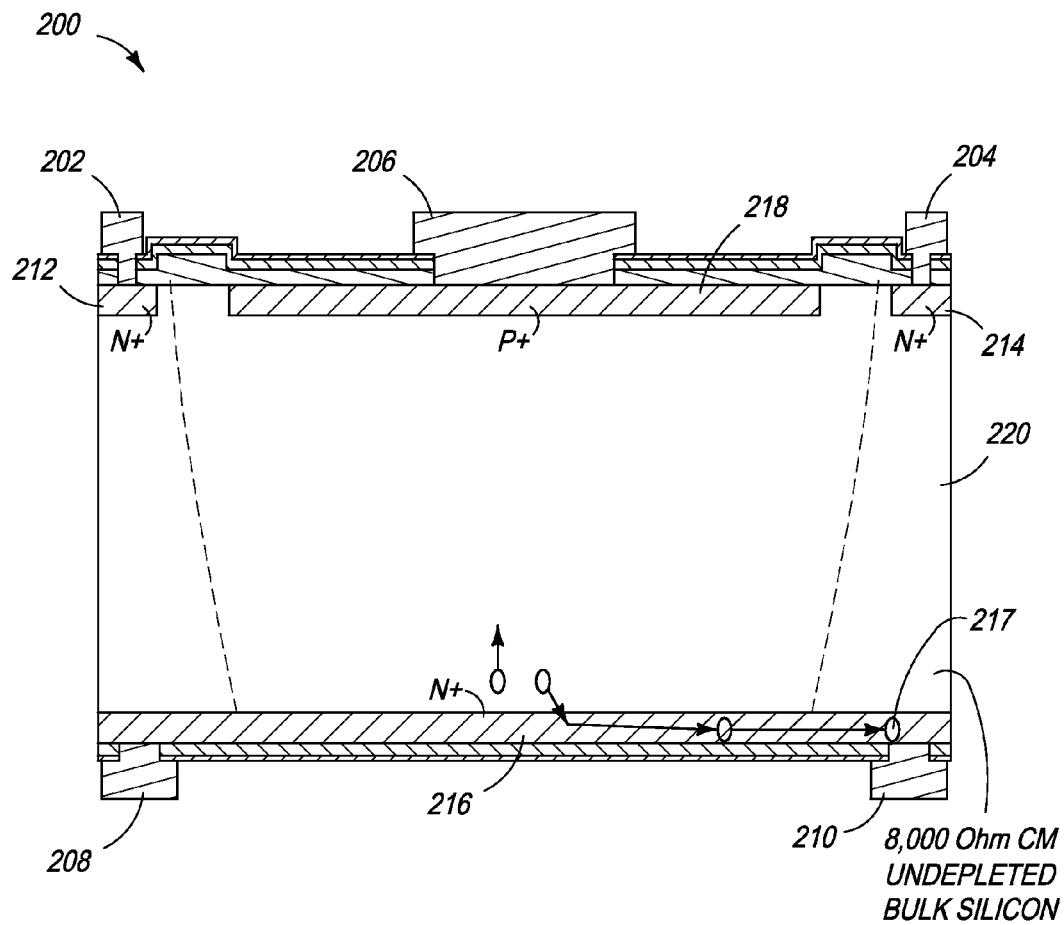
FIG. 2 shows a cross sectional view of a back side illuminated photodiode of the present invention.

FIG. 2 shows a cross sectional view of a back side illuminated photodiode 200 of the present invention. The photodiode 200 comprises front metallic cathode pads 202, 204, front metallic anode pad 206, back metallic cathode pads 208, 210, n+ doped regions 212, 214, 216 and p+ doped region 218. The front metallic cathode pads 202, 204 physically contact the n+ doped regions 212, 214 and the front metallic anode pad 206 physically contacts the p+ doped region. The back metallic cathode pads 208, 210 physically contact the n+ doped region 216. In one embodiment of the present invention the n+ doped region is of the order of 0.3 micro meters having resistivity of 0.005 Ohm-centimeter. In one embodiment, undepleted bulk silicon 220 which separates the front side and back side of the photodiode 200 has a resistivity on the order of 8000 Ohm-centimeter and a thickness in the range of 80 to 200 microns, and more specifically 130 microns.

In the photodiode 200 of the present invention, as the cathode contact pads 208, 210 are provided on the back side of the photodiode 200, therefore, when the device is fully depleted the electrons 217 need not travel the high resistivity zone 220 and can be collected at the back metallic cathodes 208, 210. In one embodiment the high resistivity zone 220 is typically of the order of 8000 Ohm-centimeter. The electrons 217 do not traverse the high resistivity zone 220 and bypasses it by traveling via the back metallic cathodes 208, 210. This bypass results in lower resistance amongst the photodiodes and photodiode array. In an embodiment, since the carriers travel through the very low resistance back side N+ doped region 216 to reach the metal contact 208, 210 the series resistance of the photodiode 200 is low and is of the order of 10 to 100 ohm. The low series resistance further results in high speed due to low RC time component, thus enabling it to be used in wide variety of high speed applications.

Figure 3:
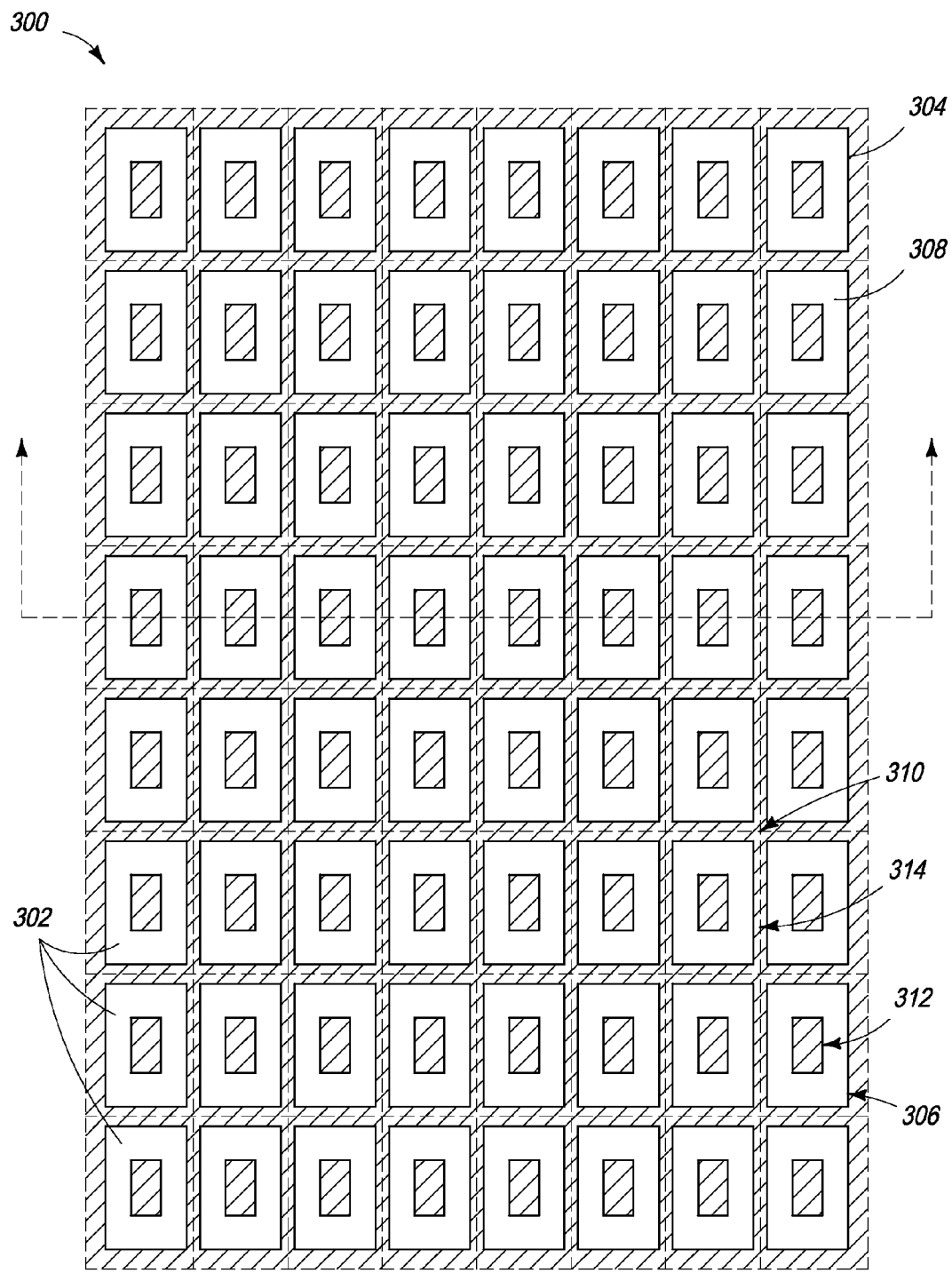
FIG. 3 depicts a top view of the photodiode array of the present invention.

FIG. 3 depicts a top view of the photodiode array 300 of the present invention. The photodiode array 300 comprises multiple photodiodes 302 arranged in an array 304 of rows 306 and columns 308. In one embodiment of the present invention the photodiode array 300 is arranged in an eight-by-eight array with a total of 64 photodiodes.

The photodiode array 300, of the present invention, further comprises cathode pad 310, anode pads 312 and a cathode metal grid 314. The cathode metal grid 314 runs through the entire array 304 interconnecting every photodiode via cathode pad 310. In one embodiment, a single bias voltage enables all the photodiodes via cathode metal grid 314.

Figure 4:
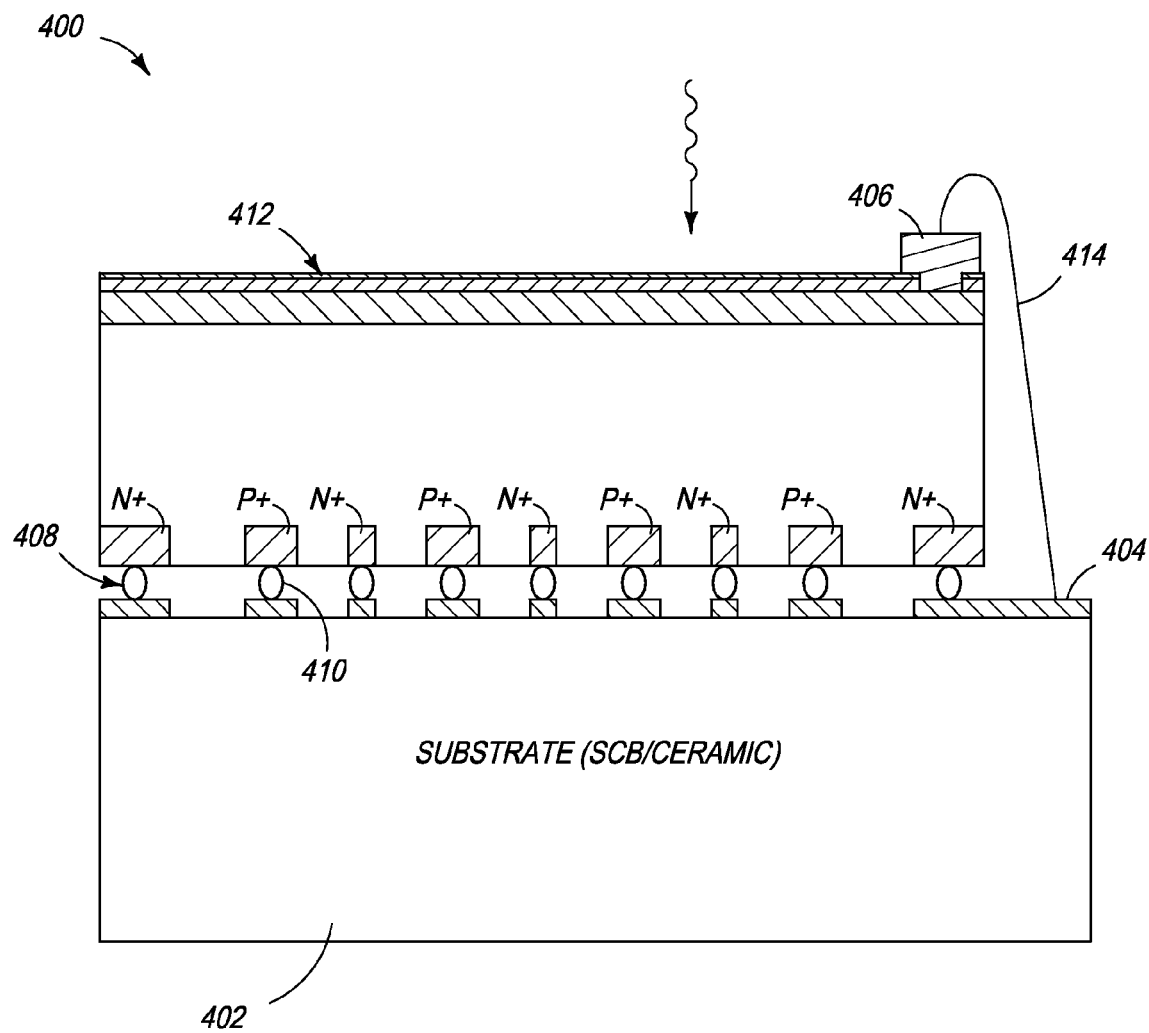
FIG. 4 depicts a flip chip assembly of the photodiode array of the present invention.

FIG. 4 depicts a flip chip assembly 400 of the photodiode array of the present invention. The flip chip assembly 400 comprises substrate 402, common cathode pad 404 on substrate 402, backside cathode 406, multiple flip chip connection 408, 410, and anti reflective layer 412. In one embodiment, the backside cathode contact 406 may be connected to the common cathode pad 404 on substrate 402 by conductive epoxy or by wire bonding 414. Photodiodes array fabricated with both front and backside cathode contacts can achieve risetime as fast as 40 nanoseconds or less, including 35, 30, 25, 20, 15 or 10 nanoseconds or less, thus making them suitable for fast scintillators such as LSO or LYSO.

Figure 5:
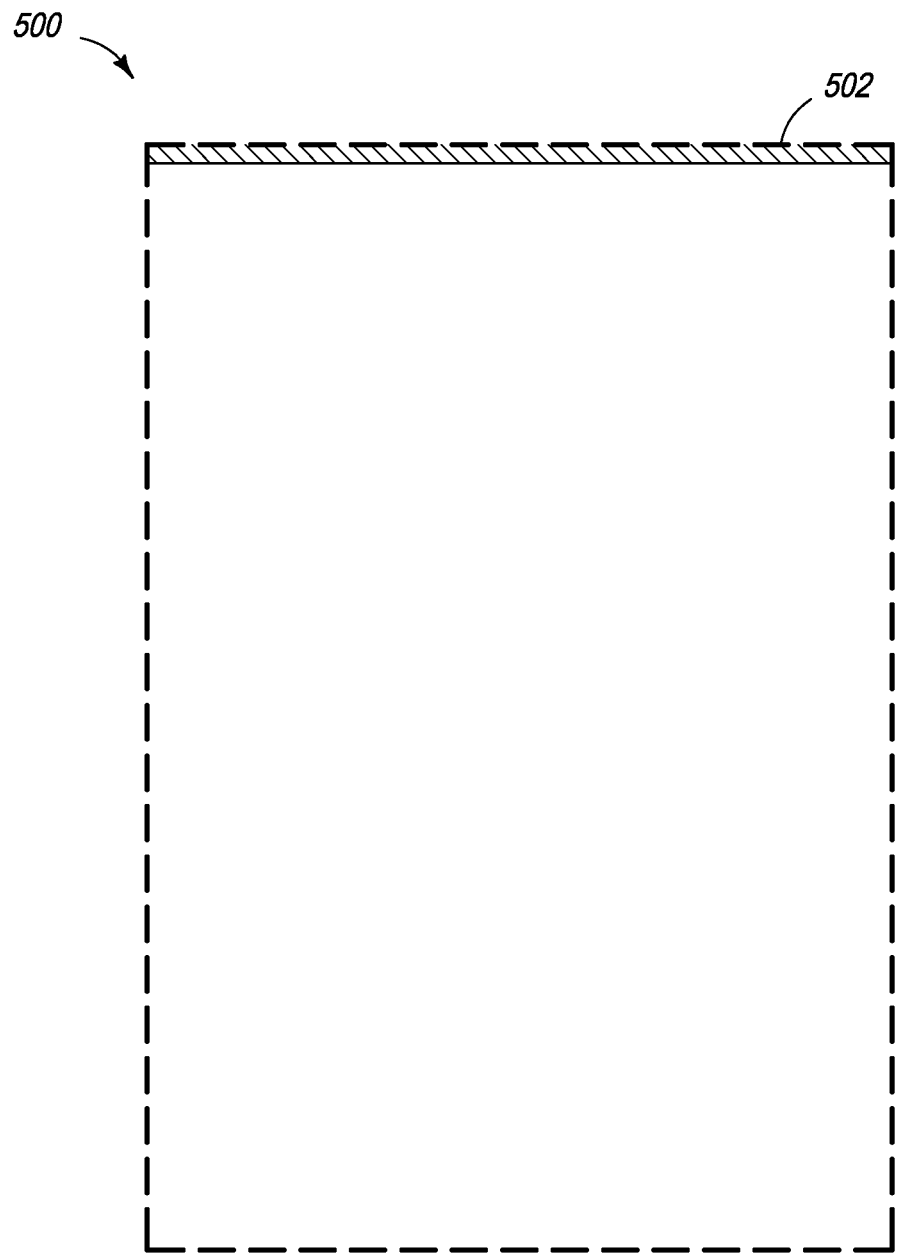
FIG. 5 depicts a backside view of layout of the photodiode of the present invention.

FIG. 5 shows an embodiment of the backside view 500 of the photodiode of the present invention. The backside view 500 comprises a metallic strip 502 acting as backside contact metal pads. The metallic strip 502 at the backside of the photodiode enables it to be used in wide variety of devices having electrical contacts at one side eliminating the need to precisely design contact on device to map exactly with the contacts of the photodiode.

Figure 6:
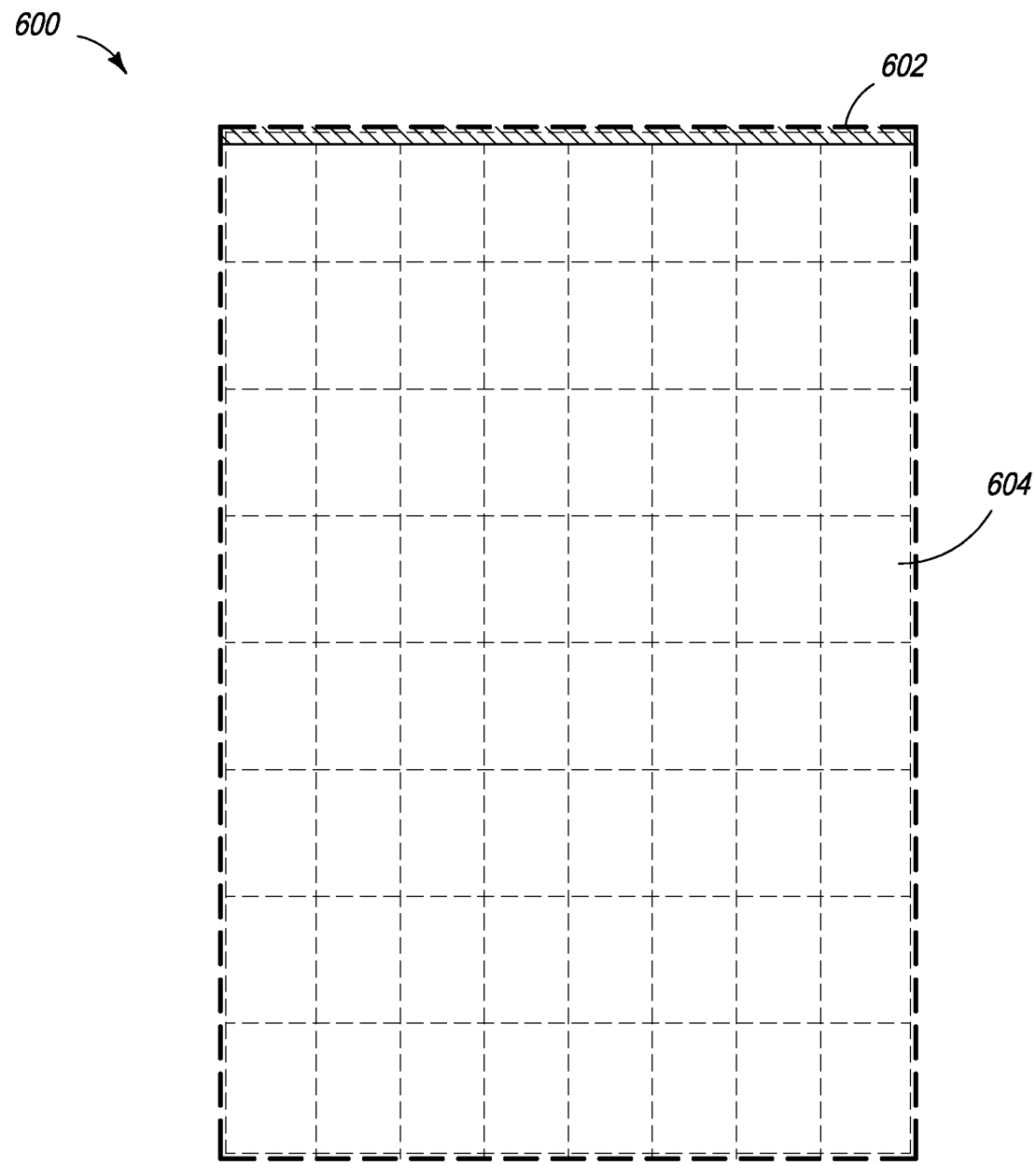
FIG. 6 depicts another backside view of layout of the photodiode of the present invention.

FIG. 6 shows another embodiment of the backside view 600 of the photodiode of the present invention. The backside view 600 comprises a metallic strip 602 connected to a metallic mesh 604 acting as backside contact metal pads. The metallic strip 602 connected to a metallic mesh 604 at the backside of the photodiodes enables it to be used in wide variety of devices having electrical contacts anywhere on the device eliminating the need to precisely design contact on device to map exactly with the contacts of the photodiode.

Figure 7:
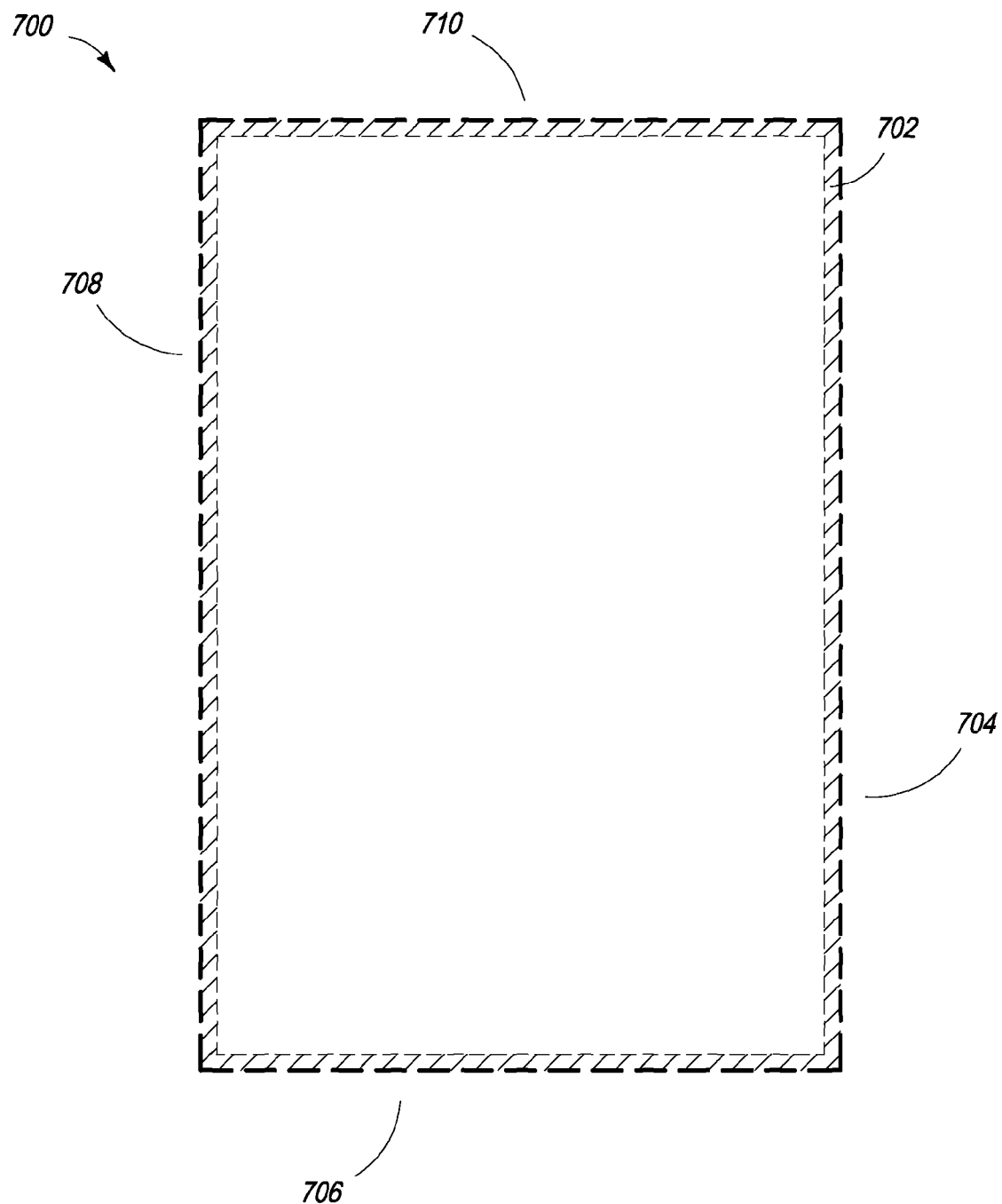
FIG. 7 depicts another backside view of layout of the photodiode of the present invention.

FIG. 7 shows a yet another embodiment of the backside view 700 of the photodiode of the present invention. The backside view 700 comprises a metallic ring 702 covering all the four sides 704, 706, 708, 710 of the photodiode and acting as backside contact metal pads. The metallic ring 702 at the backside of the photodiode enables it to be used in wide variety of devices having electrical contacts on the periphery of the device, thereby, eliminating the need to precisely design contacts on device to map exactly with the contacts of the photodiode.

FIGS. 8a through 8k illustrate exemplary manufacturing steps of the back side illuminated front side contact photodiode array of the present invention. The manufacturing steps described herein provide one manufacturing example of the photodiode array of the present invention. Modifications or alterations to the manufacturing steps, their corresponding details, and any order presented may be readily apparent to those of ordinary skilled in the art. Thus, the present invention contemplates many possibilities for manufacturing the photodiode array of the present invention and is not limited to the examples provided herein.

Figure 8A:
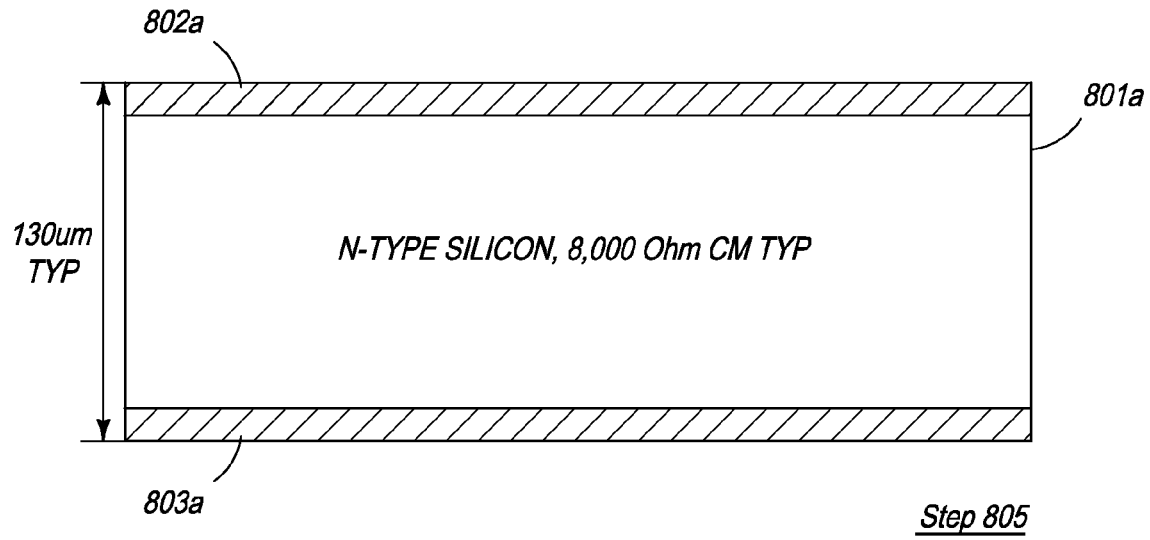
FIG. 8a illustrates a first exemplary manufacturing step of the back side illuminated front side contact photodiode array of the present invention.

FIG. 8a depicts step 805, for manufacturing of photodiode array of the present invention, where the starting material of the photodiode is device wafer or substrate wafer 801a. In one embodiment, device wafer 801a is a silicon wafer of n-type conductivity and is approximately 130 μm thick. In addition, the device wafer 801a is polished on both sides to allow greater conformity to parameters, surface flatness, and specification thickness. However, it should be understood by those of ordinary skill in the art that the above specifications are not binding and that the material type and wafer size can be easily changed to suit the design, fabrication, and functional requirements of the present invention.

At step 810, the device wafer 801a is subjected to a standard mask oxidation process that grows silicon oxide layers 802a, 803a on front and back sides, respectively, of the device wafer 801a. In one embodiment, the oxidation mask is made of silicon oxide ($SiO_2$) or silicon nitride ($Si_3N_4$) and thermal oxidation is employed to achieve mask oxidation.

Figure 8B:
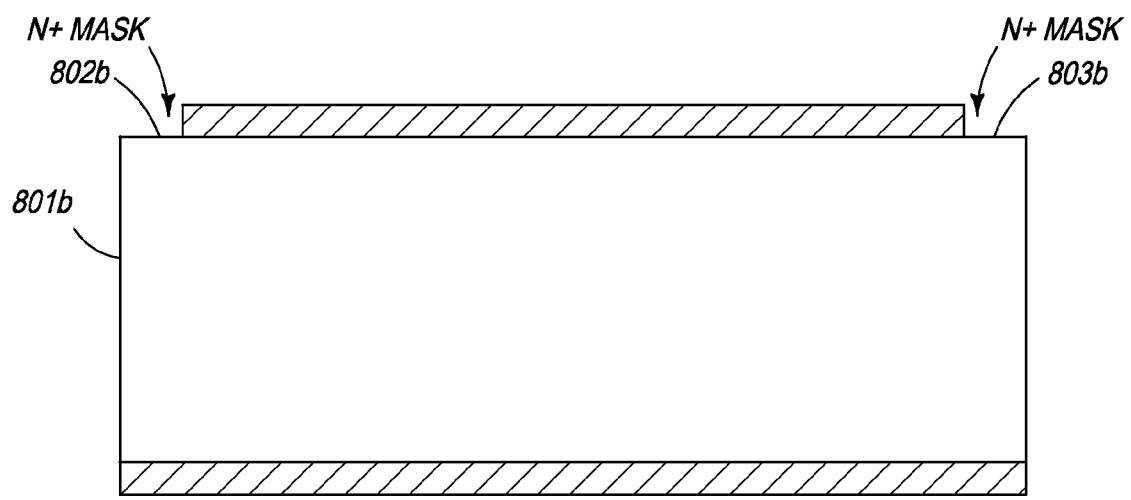
FIG. 8b illustrates a second exemplary manufacturing step of the back side illuminated front side contact photodiode array of the present invention.

As shown in FIG. 8b, after the standard mask oxidation is complete, at step 810 the device wafer is subjected to n+ photolithography on the front-side of the device wafer 801b. Photolithography includes employing a photoresist layer to etch a specific pattern on the surface of the wafer. Generally, the photoresist layer is a photosensitive polymeric material for photolithography and photoengraving that can form a patterned coating on the surface. After selecting a suitable material and creating a suitable photoresist pattern, a thin photoresist layer is applied to the front side of the device wafer 801b. In one embodiment, the photoresist layer is applied via a spin coating technique. Spin coating is well-known to those of ordinary skill in the art and will not be described in detail herein. The photoresist layer is then appropriately treated to reveal n+ diffusion regions 802b, 803b.

In one embodiment of the present invention, the device wafer 801b is subjected to n+ masking. N+ masking is employed to protect portions of device wafer 801b. Generally, photographic masks are high precision plates containing microscopic images of preferred pattern or electronic circuits. They are typically fabricated from flat pieces of quartz or glass with a layer of chrome on one side. The mask geometry is etched in the chrome layer. In one embodiment, the n+ mask comprises a plurality of diffusion windows with appropriate geometrical and dimensional specifications. The photoresist coated device wafer 801b is aligned with the n+ mask. An intense light, such as UV light, is projected through the mask, exposing the photoresist layer in the pattern of the n+ mask. The n+ mask allows selective irradiation of the photoresist on the device wafer. Regions that are exposed to radiation are hardened while those that are reserved for deep diffusion remain shielded by the n+ mask and easily removed. The exposed and remaining photoresist is then subjected to a suitable chemical or plasma etching to reveal the pattern transfer from the mask to the photoresist layer. An etching process is then employed to remove the silicon dioxide layer. In one embodiment, the pattern of the photoresist layer and/or n+ mask defines at least one region 802b, 803b devoid of the oxide layer deposited in the step 810 and is ready for n+ diffusion.

Figure 8C:
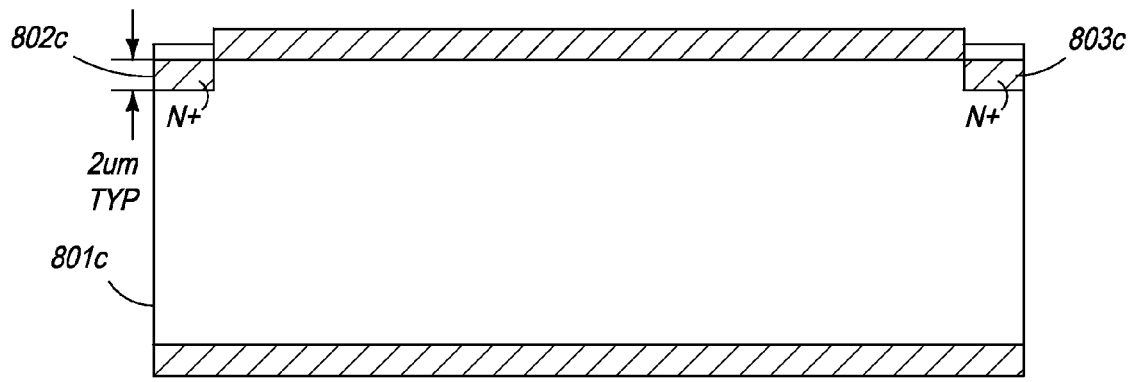
FIG. 8c illustrates a third exemplary manufacturing step of the back side illuminated front side contact photodiode array of the present invention.

Now referring to FIG. 8c, at step 815, device wafer 801c is subjected to n+ deposition 802c, 803c followed by drive-in oxidation. An appropriate amount of dopant atoms is deposited onto the substrate wafer 801c and fills the gaps left by the removed photoresist layer. In one embodiment, the dopant atoms deposited may include phosphorous dopant atoms. Thereafter, the wafer 801c is subjected to a drive-in oxidation process that is used to redistribute the dopant atoms and deposit them deeper into the wafer. In one embodiment, the thickness of n+ regions 802c, 803c are of the order of 2 μm. In addition, exposed silicon surfaces are oxidized.

Nuisance effects, which transpire when superfluous drive-in steps occur as an artifact of the overall process, tend to be a key problem in drive-in diffusion. More specifically, nuisance effects are compounded during each subsequent high temperature drive-in step, which causes further diffusion of the dopant into the substrate. Each high temperature step results in alterations, these alterations are then accounted to arrive at a thermal budget value. Thus, the thermal budget of an overall process is dependent on number of steps undertaken.

In one embodiment, the low thermal budget deep diffusion process used to manufacture the back side illuminated front side contact photodiode of the present invention comprises two steps; first, deposition/diffusion step, and a second drive-in oxidation step. The two step example provided above is by way of example only and no way limiting to the present invention. It should be understood by those of ordinary skill in the art that any number of steps may be performed keeping in mind overall cost efficiency and thermal budget of the device.

Figure 8D:
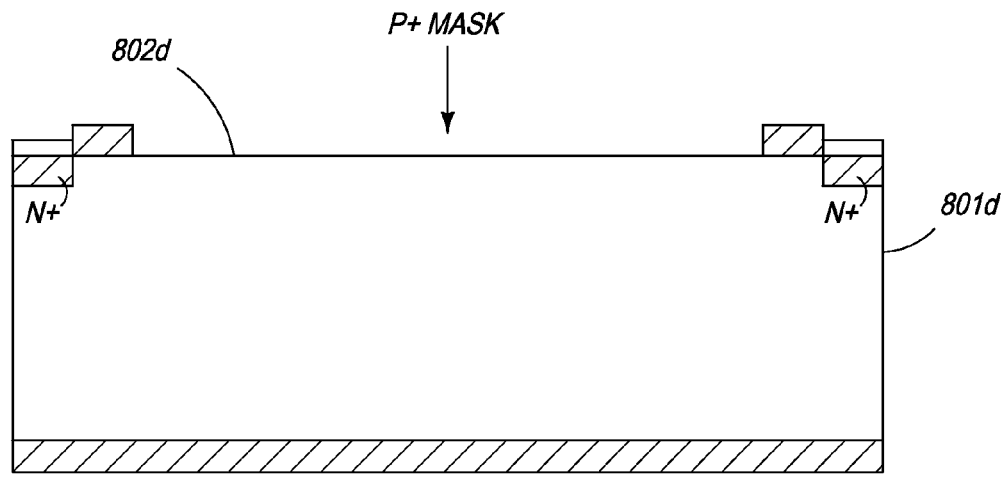
FIG. 8d illustrates a fourth exemplary manufacturing step of the back side illuminated front side contact photodiode array of the present invention.

Referring now to FIG. 8d, at step 820, the front-side of the device wafer 801d undergoes p+ photolithography process to create region 802d along with oxide etching. As with any conventional photolithography process, p+ photolithography comprises of the following tasks: substrate preparation; photoresist application; soft baking; mask alignment; exposure development, hard baking, and etching. In addition various other chemical treatments may be performed. In one embodiment, the pattern of the photoresist layer and/or p+ mask defines region 802d, which is devoid of oxide layer and is ready for p+ diffusion.

Figure 8E:
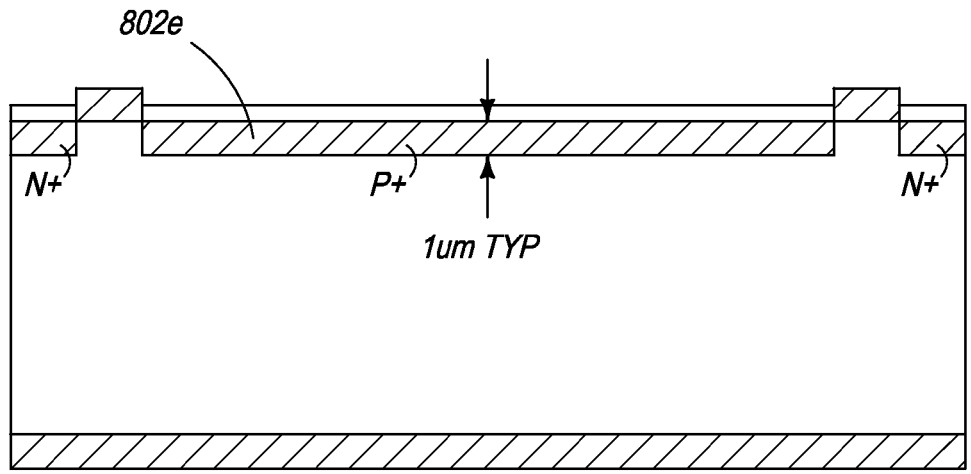
FIG. 8e illustrates a fifth exemplary manufacturing step of the back side illuminated front side contact photodiode array of the present invention.

As shown in FIG. 8e, at step 825, region 802e is subjected to p+ diffusion and drive-in oxidation. In one embodiment of the present invention the thickness of the p+ diffusion is of the order of 1 micro meter. The diffusion and drive-in oxidation allows predefined and/or predetermined thermal budget in accordance with the principles of the present invention. In one embodiment of the present invention the p+ dopant is boron.

Figure 8F:
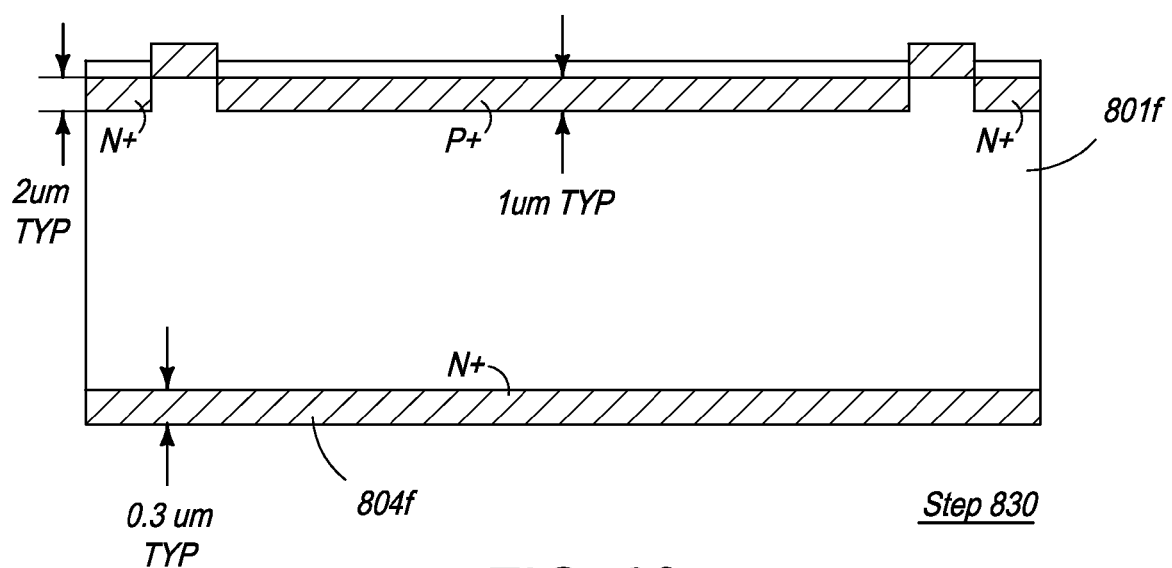
FIG. 8f illustrates a sixth exemplary manufacturing step of the back side illuminated front side contact photodiode array of the present invention.

Referring to FIG. 8f, at step 830, a photo resist layer is applied on the front side of the device wafer 801f and the oxide layer of the device wafer 801f is etched on the back side. The device wafer 801f is then stripped off of the photo resist layer and phosphorus deposition is carried out on the etched back side of the device wafer 801f. Once the phosphorus deposition is completed, drive in oxidation of the device wafer 801f at the back side of the device wafer 801f produces shallow n+ region 804f. In one embodiment, the thickness of the n+ region 804f is on the order of 0.3 μm. In another embodiment the shallow n+ region/layer 804f, on the backside, is formed by ion implantation using arsenic or antimony implantation with low dose and energy such as 5E14, 25 keV.

As shown in FIG. 8g, at step 835, anti-reflecting layer is applied both on front-side and back-side of the device wafer. In one embodiment, the anti-reflecting layer comprises of a dual layer i.e. silicon dioxide ($SiO_2$) 802g, 803g and silicon nitride ($Si_3N$) 804g, 805g. In one embodiment, silicon dioxide layer 802g, 803g of 150 angstroms is grown thermally on both sides of the device wafer 801g. Thereafter, the second anti-reflecting layer silicon nitride 804g, 805g of 425 angstroms is deposited both on the front and back sides of the device wafer 801g. The dual layers serve as an antireflection layer at 420 nm which is the emission wavelength of LSO/LYSO crystals.

Referring now to FIG. 8h, at step 840, a contact mask is etched on the front-side of the device wafer. The contact mask 802h, 803h, 804h is formed on the front-side of the device wafer 801h by using standard semiconductor technology photolithography techniques. In one embodiment, the contact windows 802h, 803h, 804h are formed by removing the anti-reflective dual layer, oxide and nitride layers, using either standard wet or standard dry etching techniques on the front-side of the device wafer 801h.

Referring to FIG. 8i, at step 845, the front-side of the device wafer 801i undergoes a process of metal lithography thereby forming front-side metal contacts 802i, 803i and 804i. The metal contacts 802i, 803i and 804i provide the necessary interface between the various devices and the photodiodes/photodiode arrays and for creating electrical connections to n+ and p+ diffused regions. The most common metals include aluminum, nickel, chromium, gold, germanium, copper, silver, titanium, tungsten, platinum and tantalum. In one embodiment of the present invention the front-side of the device wafer 801i is metal etched. Metal etching can be performed in a variety of methods including but not limited to abrasive etching, dry etching, electro etching, laser etching, photo etching, reactive ion etching, sputter etching, and vapor phase etching.

Referring to FIG. 8j, at step 850, the front-side of the device wafer 801j is coated with photoresist layer for oxide protection and the back side undergoes a contact window lithography process. The photoresist mask is formed using any of the conventional photolithographic techniques including, optical, UV, EUV photolithography, e-beam or ion beam lithography or any other similar technique. In addition at step 900, a contact mask is etched on the back-side of the device wafer 801j. The contact mask 802j and 803j is formed on the back-side of the device wafer 801j by using standard semiconductor technology photolithography techniques. Contact window mask is a dark field mask, which is used to remove silicon oxide layer in both n-type, and p-type regions requiring metal contact. In one embodiment, the contact windows 802j, 803j are formed by removing anti-reflective dual layer, oxide and nitride layers, using either standard wet or standard dry etching techniques on the front-side of the device wafer.

Referring to FIG. 8k, at step 855, the back-side of the device wafer 801k undergoes a process of metal lithography forming back-side metal contacts 802k and 803k. The metal contacts 802k and 803k provide the necessary interface between the various devices and the photodiodes/photodiode arrays and for creating electrical connections to n+ diffused region. In the metal deposition process, also known as metallization, metal layers are deposited on the wafer to create conductive pathways. The most common metals include aluminum, nickel, chromium, gold, germanium, copper, silver, titanium, tungsten, platinum and tantalum. In one embodiment of the present invention the front-side of the device wafer is metal etched. Metal etching can be performed in a variety of methods including but not limited to abrasive etching, dry etching, electro etching, laser etching, photo etching, reactive ion etching, sputter etching, and vapor phase etching.

The above examples are merely illustrative of the many applications of the system of present invention. Although only a few embodiments of the present invention have been described herein, it should be understood that the present invention might be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

We claim:

1. A photodiode array having a front side and a back side separated by a layer of silicon and a top edge, a bottom edge, a right edge, and a left edge, comprising:

a plurality of metallic cathode pads extending from a surface of said front side of the photodiode array, wherein each of said metallic cathode pads is in physical contact with at least one n+ doped region and wherein said metallic cathode pads are interconnected by a metallic connections;

a plurality of metallic cathode pads extending from a surface of said back side of the photodiode array wherein each of said metallic cathode pads is in physical contact with a second n+ doped region and wherein said metallic cathode pads are interconnected by a metallic connections; and an anode pad extending from the said front side of the photodiode array, wherein said anode pad is in physical contact with a p+ doped region.

2. The photodiode array of claim 1, wherein said photodiode array is comprised of a plurality of photodiodes, each of said photodiodes comprising a first metallic cathode pad and a second metallic cathode pad extending from said front side of the photodiode array.

3. The photodiode array of claim 1, wherein said anode pad is positioned between a first metallic cathode pad and a second metallic cathode pad.

4. The photodiode array of claim 1, wherein the layer of silicon is in the range of 80 to 200 microns thick.

5. The photodiode array of claim 1, wherein the second n+ doped region is on the order of 0.3 micrometers.

6. The photodiode array of claim 1, wherein the second n+ doped region has a resistivity of approximately 0.005 Ohm-centimeter.

7. The photodiode array of claim 1, wherein said photodiode array is comprised of a plurality of photodiodes, each of said photodiodes having a resistance on the order of 10 to 100 ohm.

8. The photodiode array of claim 1, wherein said photodiode array has a rise time of 40 nanoseconds or less.

9. The photodiode array of claim 1, wherein said metallic connections on the front side of said array define a grid of at least 64 cells, each of said cells comprising a photodiode.

10. A photodiode array having a front side and a back side separated by a layer of silicon, comprising:

a plurality of metallic cathode pads extending from a surface of said front side of the photodiode array, wherein said metallic cathode pads are interconnected by a metallic connections;

a plurality of metallic cathode pads extending from a surface of said back side of the photodiode array, wherein said metallic cathode pads are interconnected by a metallic connections;

an anode pad extending from the front side of the photodiode array, said anode pad is positioned between a first metallic cathode pad and a second metallic cathode pad.

11. The photodiode array of claim 10 wherein said photodiode array is comprised of a plurality of photodiodes, each of said photodiodes comprising at least two metallic cathode pads extending from said front side of the photodiode array.

12. The photodiode of claim 10 wherein said anode pad is in physical contact with a p+ doped region.

13. The photodiode array of claim 10 wherein the layer of silicon is in the range of 80 to 200 microns thick.

14. The photodiode array of claim 10 wherein the plurality of metallic cathode pads extending from the surface of said back side of the photodiode array is in contact with a n+ doped region.

15. The photodiode array of claim 14 wherein the n+ doped region has a resistivity of approximately 0.005 Ohm-centimeter.

16. The photodiode array of claim 10 wherein said photodiode array is comprised of a plurality of photodiodes, each of said photodiodes having a resistance on the order of 10 to 100 ohm.

17. The photodiode array of claim 10 wherein said photodiode array has a rise time of 40 nanoseconds or less.

18. The photodiode array of claim 10 wherein said metallic connections define a grid of at least 64 cells, each of said cells comprising a photodiode.

* * * * *